United States Patent [19]

Mochiji et al.

[11] Patent Number: 4,981,771
[45] Date of Patent: Jan. 1, 1991

[54] PATTERN FABRICATING METHOD

[75] Inventors: Kozo Mochiji, Hachioji; Yasunari Soda, Kokubunji; Takeshi Kimura, Higashimurayama, all of Japan

[73] Assignee: Hitachi, Ltd., Tokyo, Japan

[21] Appl. No.: 309,026

[22] Filed: Feb. 7, 1989

Related U.S. Application Data

[63] Continuation of Ser. No. 32,346, Mar. 31, 1987, abandoned, which is a continuation of Ser. No. 793,771, Nov. 1, 1985, abandoned.

[30] Foreign Application Priority Data

Nov. 2, 1984 [JP] Japan .................... 59-230119
Mar. 20, 1985 [JP] Japan .................... 60-54623

[51] Int. Cl.⁵ .................................... G03C 5/16
[52] U.S. Cl. ............................. 430/322; 430/5; 430/967; 378/34; 378/35
[58] Field of Search ............... 430/5, 311, 317, 966, 430/967, 322; 378/34, 35

[56] References Cited

U.S. PATENT DOCUMENTS 4,288,283  9/1981  Umezaki et al. ............ 156/643
4,576,884  3/1986  Reisman ..................... 430/30
4,714,668  12/1987  Uneno et al. ................ 430/316

FOREIGN PATENT DOCUMENTS 143171  12/1978  Japan ........................ 430/5
58-545   4/1983  Japan ........................ 430/5

OTHER PUBLICATIONS

Saitoh et al., "Submicron Pattern Replication . . . in X-Ray Lithography", J. Vac. Sci. Technol., B2(1), Jan.-Mar. 1984.

Primary Examiner—José Dees
Attorney, Agent, or Firm—Antonelli, Terry, Stout & Kraus

[57] ABSTRACT

When a pattern is to be fabricated by a lithography using radiation on a heavy metal layer formed on a substrate, secondary electrons are generated in a diverging form from the heavy metal layer by irradiation with a radioactive ray to expose the resist. As a result, the accuracy of the pattern to be formed on the resist is reduced. In order to prevent this, a layer to be transferred, a substrate to be worked, a mask and so on are formed with a film capable of absorbing the secondary electrons so that secondary electrons generated from the heavy metal layer may not reach the resist film. Although a pattern having a thickness of 2 microns or less could not be fabricated according to the prior art, a pattern as thin as 1.5 microns can be fabricated by the method of the present invention.

5 Claims, 6 Drawing Sheets

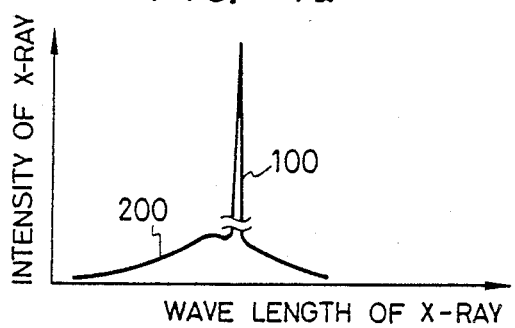
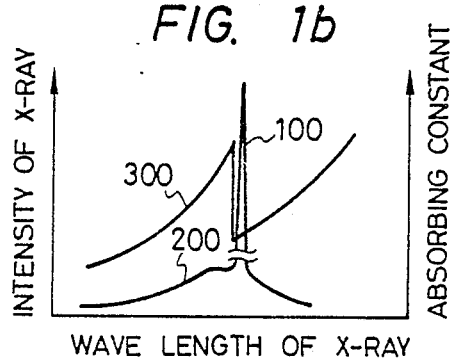
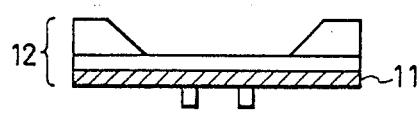 
 

PATTERN FABRICATING METHOD

This application is a continuation of application Ser. No. 07/032,346, filed Mar. 31, 1987 abandoned, which was a continuation of application Ser. No. 06/793,771, filed Nov. 1, 1985, now abandoned.

BACKGROUND OF THE INVENTION

The present invention relates to a fine patterning method using an X-ray and a mask and, more particularly, to a technique for making a pattern with great accuracy by reducing the secondary electrons generated in accordance with the exposure to the X-ray.

In the lithography using radiation, especially in the X-ray lithography, it is known in the art that the secondary electrons generated from an absorber of an X-ray mask are generated in a diverging form to act upon a resist thereby reducing the line width accuracy of a resist pattern. One example of counter measures against this reduced accuracy is disclosed in the Japan Journal of Applied Physics, Vol. 20 (1981), pp. 20 to 24.

However, no report has been found regarding the influence of secondary electrons which come from a layer to be transferred or a substrate to be worked in accordance with the exposure to the X-ray.

The worst defect of X-ray lithography for transferring a mask pattern to a layer by using the X-ray is that an absorber constructing the X-ray mask, a resist constructing the layer, a layer to be transferred, a substrate and so on absorb the X-ray, while they are being exposed to the X-ray, to emit secondary electrons such as photoelectrons or Auger electrons, which act upon the resist to degrade the accuracy of a transfer pattern. As a method of solving that problem, there is disclosed in "Submicron pattern replication using a high contrast mask and two-layer resist in X-ray lithography" by Y. Saitoh et al (J. Vac. Sci. Technol. Vol. B2 (1), Jan.-- Mar. 1984, pp. 63 to 67) a method of absorbing secondary electrons by applying a high-molecular, film to the mask or the layer to be worked. In order to form a highly accurate pattern, however, the formation of that high-molecular film may have subsidiary defects due to either an increase in the film thickness or irregularities that reduce productivity.

SUMMARY OF THE INVENTION

An object of the present invention is to provide a method of fabricating a highly accurate resist pattern in lithography using radiation.

We have found that, when a film (i.e., a film to be worked) made of a substance or such a heavy metal, e.g., gold (Au), tungsten (W) which is placed on a semiconductor substrate and which is liable to generate secondary electrons is to be worked in the radiation lithography, the secondary electrons generated as a result of radio active irradiation of that substance will diverge to irradiate a resist film, thereby reducing the accuracy of the resultant resist pattern. It has also been found that the maximum of the penetration depth (i.e., the escape depth) of those secondary electrons into the resist film is 1,000 Å.

From these findings, we have investigated the countermeasures to develop a method of fabricating a resist film by forming a thin film, hereafter referred to as a "passivation film", which is made of a substance emitting fewer secondary electrons in accordance with the exposure to the radioactive ray than the film to be worked, i.e., which is made of an element having a lower atomic number than that of the element making the film to be worked, on a substrate to be worked, which is constructed of a substrate and an overlying film to be worked. It is also found that the maximum of the thickness of that passivation film is 1,000 Å, although it varies with the quality of the material and that even the minimum thickness of about 50 Å or the limit value of the film forming technique has an effect. However, it can be easily inferred that the present invention can be applied to a thinner film in accordance with the improvement in the film forming technique.

A radiation for inducing secondary electron emission from an element is exemplified mainly by X-rays or ultraviolet light, which are also frequently used for lithography.

On the other hand, it is desired that the radiation (or the X-ray) to be used for a pattern transfer has a wavelength as monochromatic as possible. Despite this fact, an X-ray generated from its general source is frequently composed, as shown in FIG. 1, of not only an X-ray component 100 having a single wavelength but also a continuous X-ray component 200 having a low intensity but a wide wavelength distribution. The latter continuous component exposes the resist and generates the secondary electrons to degrade the transfer pattern. Since the continuous X-ray component has a low intensity but a wide wavelength distribution, moreover, its energy is so high that the degradation in the transfer pattern is usually increased. On the basis of the considerations made above, we have investigated the countermeasures to invent a variety of methods of forming an X-ray mask 12 with a layer or film, which will hereafter be referred to as a "filter film", made of such a substance, which will hereafter be referred to as a "filter substance", as is characterized to absorb a continuous X-ray component well but not the single wavelength, as shown in FIGS. 1(c) to 1(f). One example of the absorbing constant of the above-specified filter substance is plotted by a curve 300 in FIG. 1(b) against the wavelength. We have also found a method of using, as that filter substance, either: all or a portion of the substance, which makes a layer to be irradiated with the X-ray so that it may be worked, such as a substrate, a patterned layer formed on the substrate, or a resist formed on the patterned layer; or a substance containing the former substance.

When X-ray lithography is to be applied to a process for fabricating a semiconductor device, for example, the aforementioned substrate is a semiconductor wafer made of silicon, Ga or As, and the patterned layer formed on the substrate is a semiconductor layer doped with an impurity, an insulator such as $SiO_2$ or $Si_3N_4$, a wiring material such as Al or Au, or an electrode material such as Mo or W.

Since the emission of secondary electrons to be generated by irradiation with X-rays can be drastically reduced, according to the present invention, its influence upon the resist film can be accordingly reduced. This makes it possible to establish the X-ray lithography technique which can transfer patterns of high fineness of 1 microns or less and high quality. As a result, there can be attained an effect that the high resolution, miniaturization and at reduced cost can be achieved in the technical field using the lithography such as the fabrication of a semiconductor device.

BRIEF DESCRIPTION OF THE DRAWINGS

FIGS. 1a to 1f are diagrams used for explaining the summary of the invention;

DESCRIPTION OF THE PREFERRED EMBODIMENTS

EXAMPLE 1

The following description will be made with reference to FIGS. 2a to 2d.

Figure 2A:
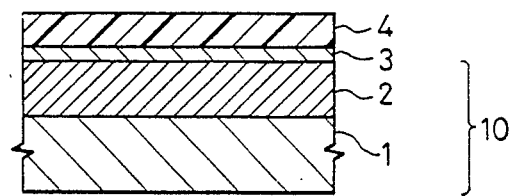
FIGS. 2a to 2d are sectional views for explaining Example 1.
Figure 2B:
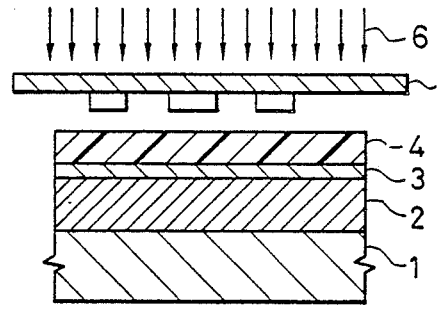

First of all, a substrate 10 to be worked was prepared by forming a W film (i.e., a film to be worked) 2 having a thickness of 0.2 microns on a silicon wafer 1. The W film 2 was covered with a passivation film, i.e., a polycrystalline silicon film 3 which was formed by the CVD method. This CVD reaction was conducted at a substrate temperature of 600° C. by using monosilane ($SiH_4$) as the reaction gas. The film thickness was 200 Å. Next, the polycrystalline silicon film 3 was covered with an X-ray resist film 4 (as shown in FIG. 2a) having a thickness of 1 micron and made of NPR (which is the product of Hitachi Kasei, Ltd.) and was then baked at 80° C. for 10 minutes. Subsequently, the X-ray resist film 4 was exposed to an X-ray 6 through an X-ray mask 5. The X-ray 6 used was the MoL Lray, and the exposed dosage was 100 mJ/cm² (as shown in FIG. 2b).

Figure 2C:
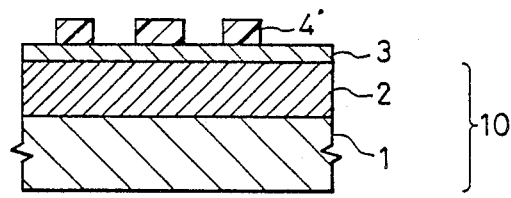
Figure 2D:
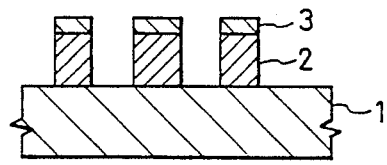

Next, a development for 3 minutes was conducted by the use of a developer NMD-3, a product of Tokyo Ohka, Ltd., to form a resist pattern 4' (as shown in FIG. 2c, and a post baking was then conducted at 80° C. for 20 minutes. Subsequently, the passivation film 3 and the W film 2 were etched by reactive ion etching using sulfur hexafluoride ($SF_6$) and that resist pattern 4' as a mask. The gas pressure of the $SF_6$ was 20 Pa, and the etching period was 2 minutes. Next, the pattern fabrication was completed by removing the remaining resist film. As a result, a pattern having a thickness of 0.3 microns could be formed on the W film. Incidentally, the thickness of the pattern was limited to 0.5 microns when no passivation film was used.

Since, in that etching, the etching rate of the polycrystalline silicon film 3 was about six times as high as that of the W film, the increase in the etching period as a result of the introduction of the passivation film raised no substantial, practical problem.

On the other hand, the passivation film left might be removed or not, if necessary.

In the present invention, the substrate to be worked had not be formed with the film to be worked all over the surface of the semiconductor substrate, and the present invention could naturally be applied even to the case in which two or more films to be worked were present. On the other hand, the number of the passivation film had not always be one but might be two or more, and the present invention could be put into practice a film even if a film failing to act as the passivation film was sandwiched between the two layers.

Although the present Example used polycrystalline silicon as the material of the passivation film, it is evident that the passivation film can be made of not only $SiO_2$ or $Si_3N_4$ but also an element having a lower atomic number, or its compound, or other various organic substances.

EXAMPLE 2

As in Example 1, a substrate to be worked was formed with a passivation film, to which a photo resist (AZ1350J: a product of Hoechist, Ltd.) was applied to have a film thickness of 0.7 microns.

Next, a high-pressure mercury lamp was used to effect exposure of 45 mJ/cm² thereby to fabricate a pattern. Although a pattern having a thickness of 2 microns or less could not be fabricated in the absence of the passivation film, a pattern having a thickness of 1.5 microns could be fabricated in the presence of the passivation film.

EXAMPLE 3

Figure 3A:
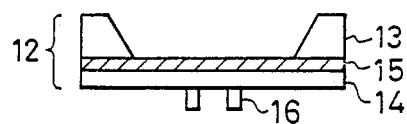
FIGS. 3a, 3b, 4 and 5 are diagrams used for explaining Example 3.
Figure 3B:
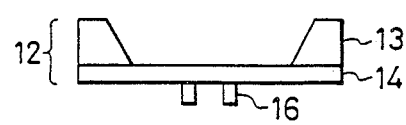
Figure 4:
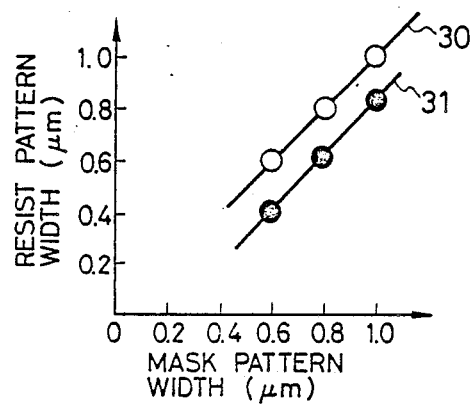

This Example will be described with reference to FIGS. 3 to 5. The single wavelength X-ray generated from a rotary cathode type X-ray source using a Mo target was the MoL characteristic X-ray and had a wavelength of 5.4 Å. Therefore, an X-ray mask 12 was formed with a Mo film 15 having an absorption end wavelength of 4.8 Å. The thickness of the Mo film was set at 3,500 Å. Reference numerals 13 and 14 indicate a mask supporting frame of silicon and a support of the PIQ, respectively. Numeral 16 indicates an Au absorber for forming a mask pattern. FIG. 3b shows the structure of the X-ray mask of the prior art.

Next, there is presented the result of the pattern transfer using that mask. An NPR resist, a product of Hitachi Kasei, Ltd., was applied to the silicon substrate to form a resist film having a thickness of 1 micron, to which a pattern was transferred by using the above-specified ray source and mask. The ray source was operated at a voltage of 20 KV to emit an X-ray having an intensity of 150 mJ/cm². The Mo film 15 having the thickness of 3,500 Å absorbed about 30% of the X-ray having a wavelength of 5.4 Å and about 90% of the X-ray having a wavelength around 4.8 Å. The transfer pattern obtained is plotted in the resist pattern width in FIG. 4. A curve 30 corresponds to the case in which the mask of the present Example was used, whereas a curve 31 corresponds to the case in which the mask of the prior art was used. The resist pattern width in high fidelity to the mask pattern width was attained in the case of the curve 30, but the in the case of the curve 31 was smaller by about 0.2 microns than the mask pattern width. Incidentally, since the NPR resist was of the positive type, as should be noted, the fact that the pattern width was smaller than the mask pattern width means that the pattern width of the exposed portion of the transfer pattern was larger than the mask pattern width.

Figure 5:
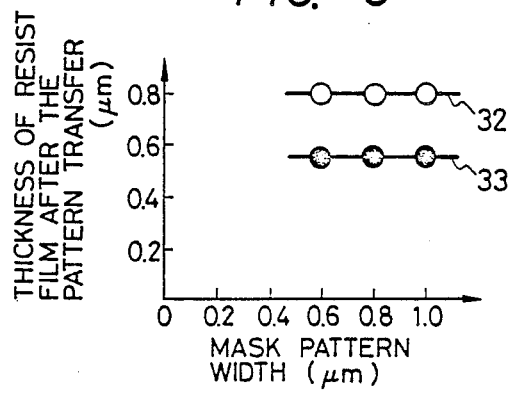

FIG. 5 plots the thickness of the resist film after the pattern transfer. From a curve 32 when the mask of the present Example was used, the film thickness of the curve 33 when the mask of the prior art was used was smaller by about 0.25 microns. This means that more secondary electrons were emitted with the use of the conventional mask to irradiate the entire surface of the resist so that the surface of the resist film reacted accordingly more. That portion of the positive type resist, which had been irradiated with the X-ray or the electrons, i.e., which had reacted, dissolved into the developer so that it was removed.

For the thickness of the Mo film 15 of 1,000 Å or more, similar results were obtained. Despite this fact, the cost for fabricating filter film rose so high for the thickness 10,000 Å that the practicality was lost.

EXAMPLE 4

Figure 6:
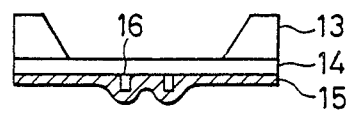
FIGS. 6 and 7 are diagrams used for explaining Example 4.
Figure 7:
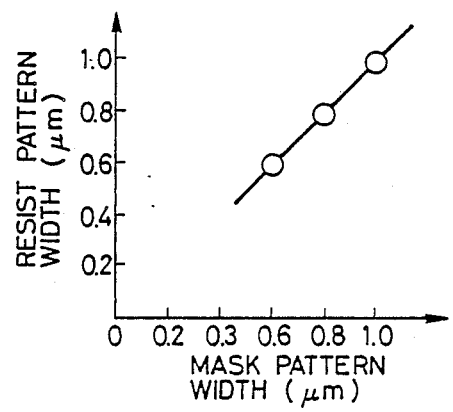

This Example will be described with reference to FIGS. 6 and 7.

Au was used to fabricate an absorber pattern (or a mask pattern) 16, on which a Mo film 15 was formed. This Mo film 15 was used as the filter film and the passivation film for the mask pattern 16. The X-ray mask could be elongated by this method. The relationship between the mask size and the resist size when pattern transfer was conducted by using that mask is plotted in FIG. 7. From this Figure, it is found that the mask size and the resist size are equal so that the pattern transfer conducted was of high quality. The practical conditions such as the ray source, the resist, the exposed dosage or the thickness of the filter film were identical to those of the Example 3.

EXAMPLE 5

Figure 8:
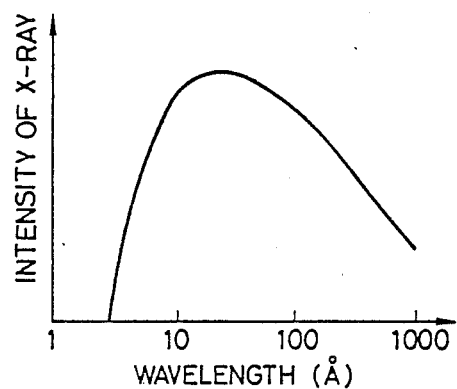
FIGS. 8 to 11 are diagrams used for explaining Example 5.
Figure 9:
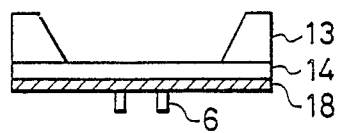
Figure 10:
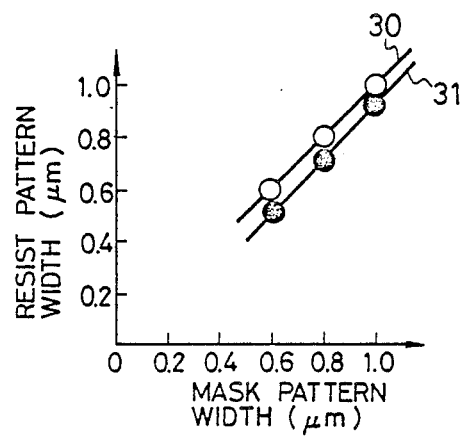
Figure 11:
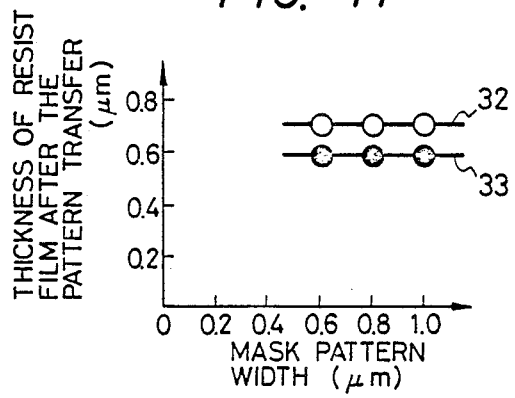

A synchrotron orbital radiation (which will be abbreviated to "SOR") was used as the ray source. The SOR X-ray when the electron energy of an accurative ring was set at 1 GeV has its wavelength distribution shown in FIG. 8 and had its maximum intensity of about 20 Å. In this case, an Al film having an absorption end wavelength of 8 Å was used. The structure of the mask is shown in FIG. 9. On the mask support 14, there was formed as the filter film an Al film 18 having a thickness of 1.5 microns, on which the mask pattern 6 was formed, thus fabricating the mask. The experimental results obtained from the cases in which both the above-specified mask and the mask of the prior art were used are shown in FIGS. 10 and 11, as in the Example 3. With close reference to FIGS. 10 and 11, the effect of the present invention can be confirmed like the Example 3. It has been confirmed that the present invention could be practiced when the filter film (or the Al film) had a thickness of 0.1 microns or more, but the cost for forming the filter film rose for the film thickness of 1.0 micron or more.

EXAMPLE 6

Figure 12:
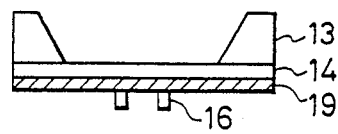
FIGS. 12, 13a, 13b and 14 are diagrams used for explaining Example 6.
Figure 13A:
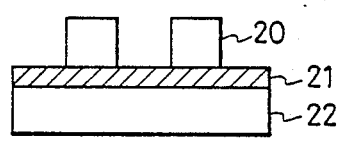
Figure 13B:
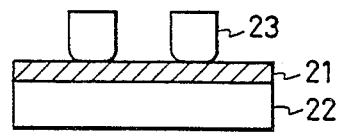
Figure 14:
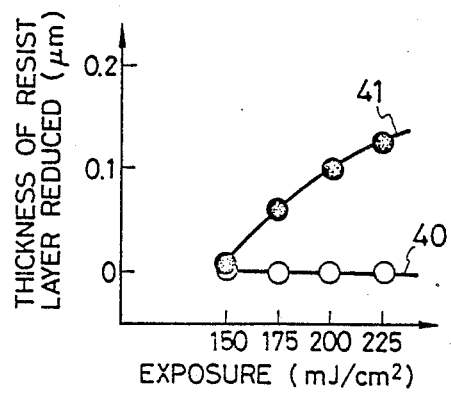

A rotary cathode type ray source which used a target made of Al was used. The X-ray in this case was Al K characteristic X-ray having a wavelength of 8.3 Å. A layer to be worked was prepared by covering a silicon substrate by the vacuum deposition with a tungsten (W) film having a thickness of 3,000 Å and by applying an NPR resist film to the tungsten film. The tungsten forming part of the worked layer was used as the filter substance of the mask. The structure of the mask is shown in FIG. 12. A filter film 19 had a thickness of 3,000 Å. The exposed dosage of the X-ray was set at 200 mJ/cm$^2$ on the wafer. FIG. 13a is a sectional view showing the worked layer after the pattern transfer was conducted by the use of that mask, i.e., after an irradiation with the X-ray and then a development were conducted. Reference numeral 20 indicates a resist film to which the pattern was transferred in a remarkably high quality. FIG. 13b is a sectional view showing the worked layer when the mask of the prior art was used. Numeral 23 indicates the resist film after the transfer, the portions of which contacting a W film 21 were deformed by the irradiation with the secondary electrons coming from the W film 21. FIG. 14 plots the relationship between the reduction in the thickness of the resist film due to that deformation and the exposed dosage. A curve 40 corresponds to the case of the present invention whereas a curve 41 corresponds to the case in which the mask of the prior art was used. From FIG. 14, it is found that the thickness reduction of the curve 40 was substantially zero whereas the number of the secondary electrons increased in the case of the curve 41 with the increase of the exposed dosage of the X-ray so that the thickness reduction also increased. The present invention could be practised for a thickness of the film of 1,000 Å or more, but the cost for forming the filter film rose for a film thickness of 10,000 Å or more.

What is claimed is:

1. A method of transferring a pattern, comprising:
   forming a resist layer on a surface of a wafer to be worked;
   providing a mask comprising a mask supporting frame, a support provided on a lower side of said supporting frame, an absorber pattern supported on a lower surface of said support and a filter film provided on an upper side of said supporting frame opposite said a lower side and on an upper surface of said support opposite said lower surface for absorbing X-rays in a shorter wavelength range than a wavelength range necessary to expose said resist layer; and
   irradiating said resist layer through said mask with an X-ray wherein said X-ray passes through said mask from a side of said mask on which said filter film is provided to an opposite side;
   wherein said filter film is made of a filter substance selected from the group consisting of Mo, Al and W and having an absorption end in said shorter wavelength range and having a larger absorbing constant in said shorter wavelength range than in said wavelength range necessary to expose said resist layer.

2. A method of transferring a pattern according to claim 1, wherein said filter substance is Mo.

3. A method of transferring a pattern according to claim 1, wherein said filter substance is Al.

4. A method of transferring a pattern according to claim 1, wherein said filter substance is W.

5. A method of transferring a pattern according to claim 1, wherein said filter substance is a substance contained on said surface of said wafer to be worked.

* * * * *